United States Patent
Fukuda et al.

(10) Patent No.: US 6,713,120 B2
(45) Date of Patent: Mar. 30, 2004

(54) SUBSTRATE PROCESSING SYSTEM AND SUBSTRATE PROCESSING METHOD

(75) Inventors: Yuji Fukuda, Austin, TX (US); Kunie Ogata, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/186,678

(22) Filed: Jul. 2, 2002

(65) Prior Publication Data

US 2002/0168191 A1 Nov. 14, 2002

Related U.S. Application Data

(62) Division of application No. 09/694,820, filed on Oct. 24, 2000, now Pat. No. 6,431,769.

(30) Foreign Application Priority Data

Oct. 25, 1999 (JP) ............................................. 11-302214

(51) Int. Cl.[7] ................................................. B05D 3/00
(52) U.S. Cl. ............................. 427/9; 427/10; 427/444
(58) Field of Search ................................ 427/9, 10, 444

(56) References Cited

U.S. PATENT DOCUMENTS

| | | | |
|---|---|---|---|
| 5,393,624 A | * | 2/1995 | Ushijima ..................... 430/30 |
| 5,939,130 A | | 8/1999 | Shiraishi et al. |
| 5,944,894 A | | 8/1999 | Kitano et al. |
| 6,004,047 A | | 12/1999 | Akimoto et al. |
| 6,221,787 B1 | * | 4/2001 | Ogata ......................... 438/758 |
| 6,266,125 B1 | | 7/2001 | Fukuda et al. |
| 6,281,962 B1 | | 8/2001 | Ogata et al. |

FOREIGN PATENT DOCUMENTS

JP 06-326019 * 11/1994

OTHER PUBLICATIONS

Australian Patent Office Search Report dated Mar. 8, 2002.

* cited by examiner

Primary Examiner—Katherine A. Bareford
(74) Attorney, Agent, or Firm—Rader, Fishman & Grauer PLLC

(57) ABSTRACT

A coating unit for coating a substrate with a treatment solution and a peripheral aligner, which has a mounting table rotatable and movable in at least one direction and irradiates the peripheral portion of the substrate on the mounting table with light from an irradiating portion to expose a coating film on the substrate, are provided in a substrate processing system. The peripheral aligner has film thickness measuring means provided with a sensor member for measuring a film thickness of the coating film. It is not necessary to separately provide a unit for measuring the film thickness outside of the system, thus preventing the substrate from being contaminated or dropped to be damaged when the film thickness is measured.

10 Claims, 11 Drawing Sheets

SUBSTRATE PROCESSING SYSTEM AND SUBSTRATE PROCESSING METHOD

This application is a divisional of U.S. patent application Ser. No. 09/694,820 filed Oct. 24, 2000 now U.S. Pat. No. 6,431,769 issued Aug. 13, 2002.

BACKGROUND OF THE INVENTION

1. Field of the Invention

The present invention relates to a substrate processing system and a substrate processing method.

2. Description of the Related Art

In the photography in processes of semiconductor device fabrication, for example, resist coating treatment for forming a resist film on the surface of a semiconductor wafer (described as "a wafer" hereinafter), exposing processing for exposing the wafer by irradiating a pattern thereon, developing treatment for developing the exposed wafer, and the like are performed. Processing units for performing such processing and treatments are integrated into one system to form a coating and developing system.

Incidentally, it is important for the resist film, which is coated on the wafer before the exposing processing of a pattern, to have a predetermined film thickness in order to suitably perform predetermined lithography. Therefore, the film thickness of the resist film on the wafer is inspected before the pattern is exposed, and when it is over a predetermined allowable value, the rotational frequency of the wafer in a coating unit, for example, is controlled based on the inspection.

Conventionally, an operator selects a wafer before exposing processing out of the coating and developing system to perform the inspection of the film thickness of the resist film with use of a film thickness measuring unit for inspection provided separately from the coating and developing system.

SUMMARY OF THE INVENTION

However, it is necessary to transfer the wafer from the coating and developing system to the unit for inspecting the film thickness in such a manner, thus requiring both labor and time. Further, there is a danger that the wafer is contaminated while being transferred. Furthermore, there is a risk that an operator drops the wafer by mistake.

The present invention is made in view of the aforesaid points and its object is to inspect the film thickness of the resist film on the wafer in the single system by providing film thickness measuring means in a peripheral aligner in which the existing mechanism in the coating and developing system can be utilized.

A first aspect of the present invention is a processing system for processing a substrate, comprising a coating unit for coating the substrate with a treatment solution and a peripheral aligner having a mounting table rotatable and movable in at least one direction and irradiating the peripheral portion of the substrate on the mounting table with light from an irradiating portion to expose a coating film on the substrate, the peripheral aligner having film thickness measuring means provided with a sensor member for measuring the film thickness of the coating film.

A second aspect of the present invention is a method of processing a substrate with use of a substrate processing system, the substrate processing system comprising a peripheral aligner for irradiating the peripheral portion of the substrate with light to expose a coating film applied on the substrate and a unit for measuring a film thickness of the coating film, the method comprising the step of irradiating the peripheral portion of the substrate with the light to expose the coating film after measuring the film thickness of the coating film on the substrate. In this case, the step of measuring the film thickness of the coating film once again may be added after the coating film is exposed.

A third aspect of the present invention is a process of performing processing on a substrate with use of a substrate processing system comprising a peripheral aligner, a unit for measuring a film thickness of a coating film, and further a coating unit for coating the substrate with the coating film, the process comprising the steps of using a test substrate as the substrate of which film thickness is measured, performing predetermined coating treatment on a production substrate in the coating unit when a measurement value is within an allowable range as a result of a measurement of the film thickness, and measuring the film thickness of another test substrate subjected to coating treatment in the coating unit after making a necessary correction to the coating unit when the measurement value is out of the allowable range.

According to the present invention, the peripheral aligner has a mounting table rotatable and movable in at least one direction. Therefore, it is possible to suitably perform a film thickness measurement at, for example, a predetermined point on the substrate by utilizing such mechanism, and in addition it is not necessary to provide a unit having the film thickness measuring means separately from the substrate processing system.

In the substrate processing method according to the present invention, the film thickness measurement and peripheral exposure are performed using the same substrate processing system, whereby it is not necessary to perform the film thickness measurement in another unit which is separately provided. Moreover, since the coating film on the peripheral portion of the substrate is exposed after the film thickness of the coating film on the substrate is measured, it is possible to measure the film thickness of the coating film before peripheral exposing processing, which can be material for determining whether preceding treatment is properly performed or not.

In the substrate processing method according to the present invention, a substrate exclusive to test is housed in a cassette beforehand separately from, for example, a production substrate, more specifically, a substrate which undergoes predetermined processing to be shipped as a product, and the film thickness is initially measured with the test substrate before coating treatment or subsequent processing is performed on the production substrate. Then, predetermined coating treatment is subsequently performed on the production substrate in the coating unit when the measurement value is within the allowable range. On the other hand, when the measurement value is out of the allowable range, another test substrate is taken out of the cassette, then subjected to coating treatment in the coating unit and the film thickness thereof is measured after a necessary correction is made to the coating unit. As a result of the measurement, when the film thickness is within the allowable range, processing is performed on the production substrate, and when the film thickness is out of the allowable range, the correction is again made to the coating unit and thereafter other test substrates are subsequently measured the film thickness thereof. As a consequence, the yield of the production wafer can be improved. The above-described film thickness measurement with the test substrate may be periodically performed in a break of a lot of the production substrates, or after processing is performed on a predetermined number of the production substrates.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENT

A preferred embodiment of the present invention will be described below with reference to the accompanying drawings.

Figure 1:
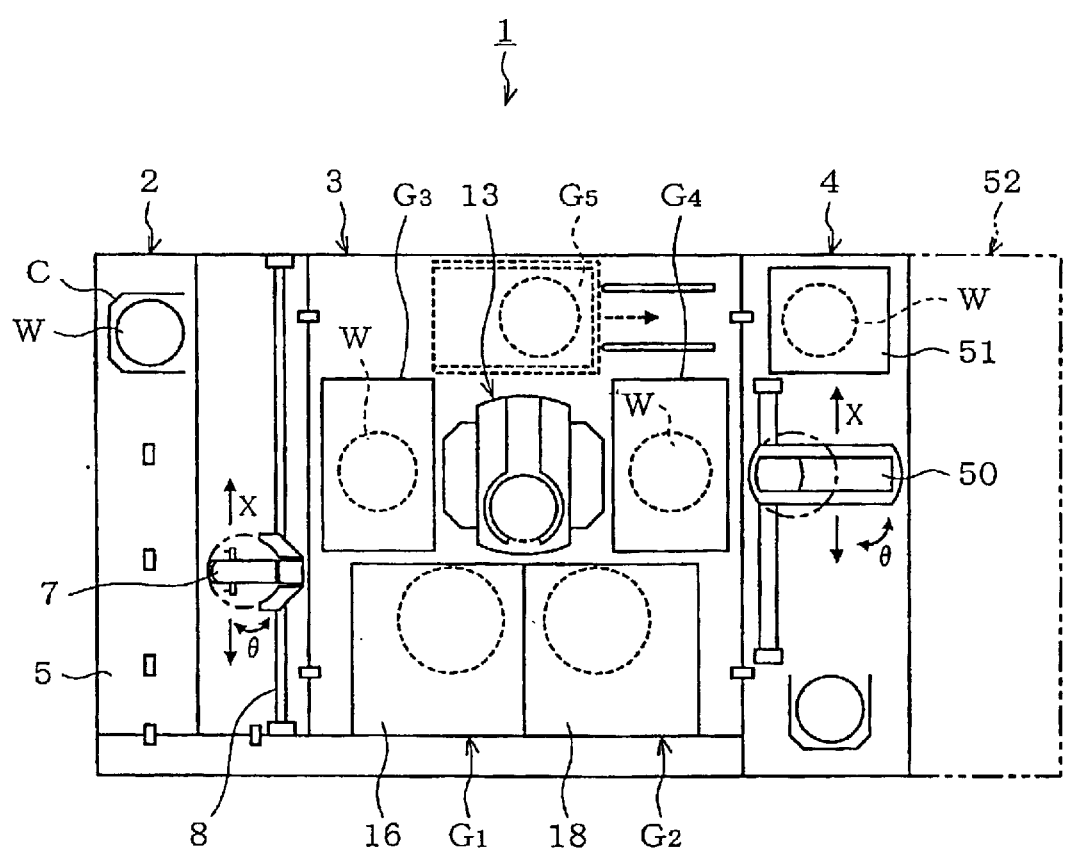
FIG. 1 is a plane view showing an appearance of a coating and developing system according to the present embodiment.
Figure 2:
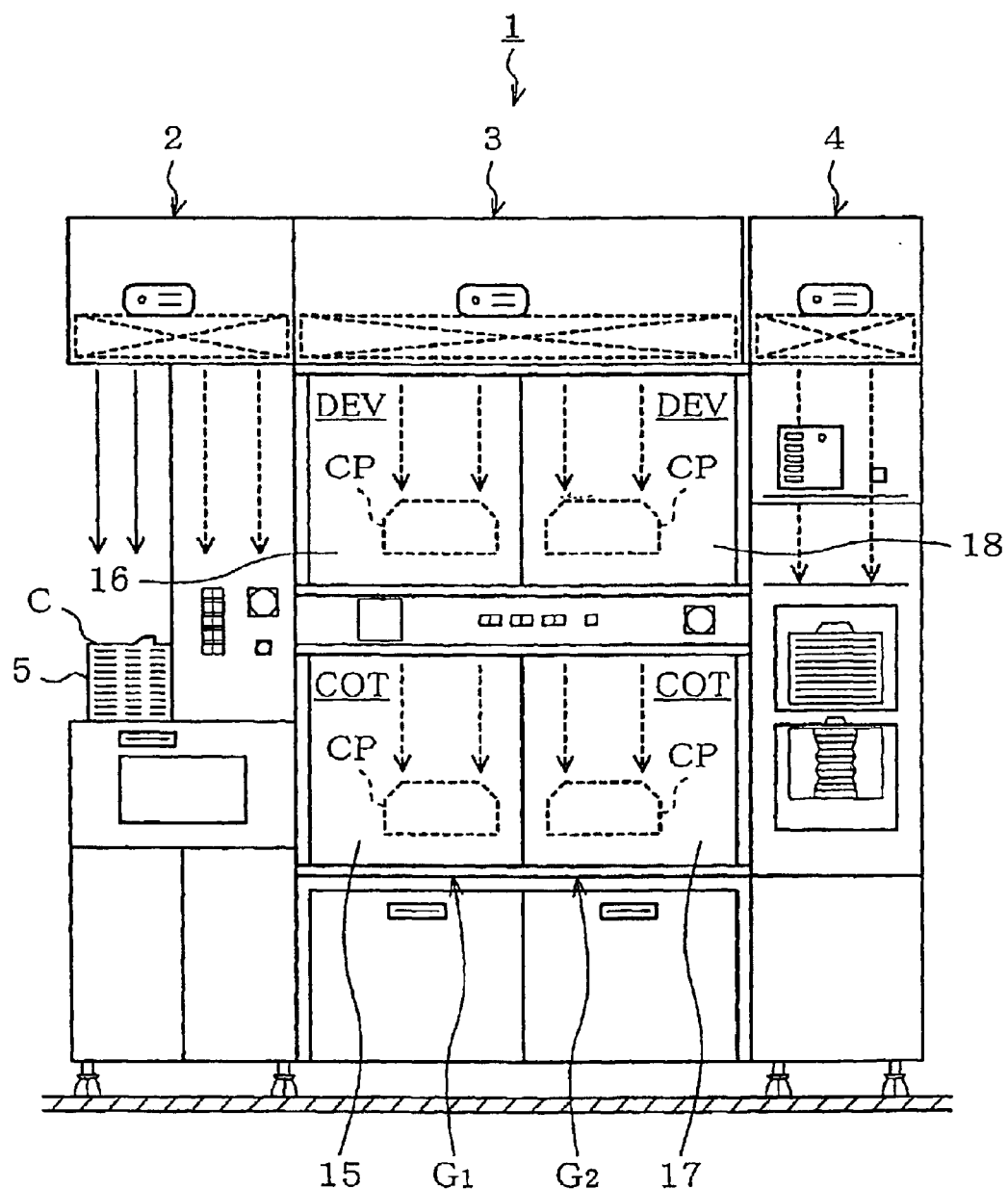
FIG. 2 is a front view of the coating and developing system in FIG. 1.
Figure 3:
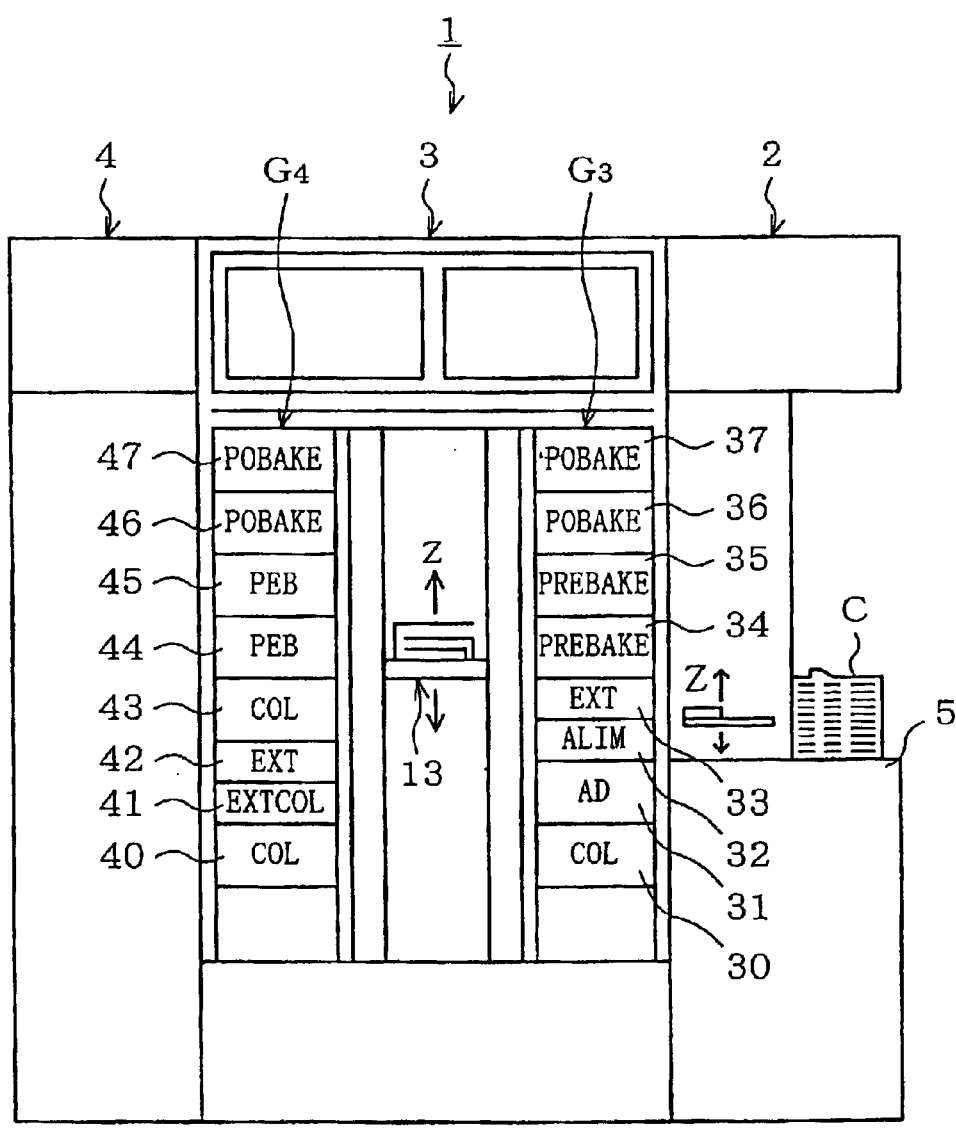
FIG. 3 is a rear view of the coating and developing system in FIG. 1.

FIG. 1 is a plane view of a coating and developing system 1 as a substrate processing system according to the present embodiment, FIG. 2 is a front view of the coating and developing system 1, and FIG. 3 is a rear view of the coating and developing system 1.

As shown in FIG. 1, the coating and developing system 1 has a structure in which a cassette station 2 for carrying, for example, 25 wafers from/to the outside to/from the coating and developing system 1 in the unit of cassette and for carrying the wafers W into/from a cassette C, a processing station 3 in which various kinds of multi-tiered processing units for performing predetermined processings one by one in the coating and developing process are disposed, and an interface section 4 for receiving and delivering the wafer W from/to an aligner 52 provided adjacent to the processing station 3, are integrally connected.

In the cassette station 2, a plurality of cassettes C are well mounted at predetermined positions on a cassette mounting table 5 serving as a mounting portion in a line in an X-direction (a vertical direction on FIG. 1). Further, a wafer carrier 7, which is transferable in the direction of alignment of the cassettes (the X-direction) and in the direction of alignment of the wafers W housed in the cassette C (a Z-direction; a vertical direction), is provided to be movable along a carrier guide 8 and is selectively accessible to the respective cassettes C.

The wafer carrier 7 is structured so as to access also an alignment unit 32 and an extension unit 33 which are included in a third processing unit group G3 on the side of the processing station 3 as will be described later.

In the processing station 3, a main carrier unit 13 is provided in the center part thereof, and various kinds of processing units are multi-tiered on the periphery of the main carrier unit 13 to compose processing unit groups. In the coating and developing system 1, there are four processing unit groups G1, G2, G3 and G4, and the first and the second processing unit groups G1, G2 are disposed on the front side of the coating and developing system 1, the third processing unit group G3 is disposed adjacent to the cassette station 2, and the fourth processing unit group G4 is disposed adjacent to the interface section 4. Further, as an option, a fifth processing unit group G5 depicted by broken lines can be additionally arranged on the rear side of the coating and developing system 1.

In the first processing unit group G1, as shown in FIG. 2, two kinds of spinner-type processing units, for example, a resist coating unit 15 in which the wafer W undergoes resist coating, and a developing unit 16 in which the wafer W undergoes treatment with a developing solution supplied are two-tiered in the order from the bottom. Also in the case of the second processing unit group G2, a resist coating unit 17 and a developing unit 18 are similarly two-tiered in the order from the bottom.

In the third processing unit group G3, as shown in FIG. 3, a cooling unit 30 for cooling the wafer W, an adhesion unit 31 for increasing the fixability between a resist solution and the wafer W, the alignment unit 32 for aligning the wafer W, the extension unit 33 for keeping the wafer W waiting, prebaking units 34, 35 for performing heat treatment before exposing processing, and postbaking units 36, 37 for performing heat treatment after developing and so on are, for example, eight-tiered in the order from the bottom.

In the fourth processing unit group G4, a cooling unit 40, an extension and cooling unit 41 for spontaneously cooling the housed wafer W, an extension unit 42, a cooling unit 43, post-exposure baking units 44, 45 for performing heat treatment on the wafer W after exposing processing, and postbaking units 46, 47 and so on are, for example, eight-tiered in the order from the bottom.

In the interface section 4, provided is a peripheral aligner 51 for irradiating the peripheral portion of the wafer W with light to expose a resist film formed on the wafer W, and measuring a film thickness of the resist film if necessary as described later. Moreover, a wafer carrier 50, which is provided in the center part of the interface section 4, is structured so as to be accessible to the extension and cooling unit 41, the extension unit 42 which are included in the fourth processing unit group G4, the peripheral aligner 51, and the aligner 52 which is shown by broken lines.

Figure 4:
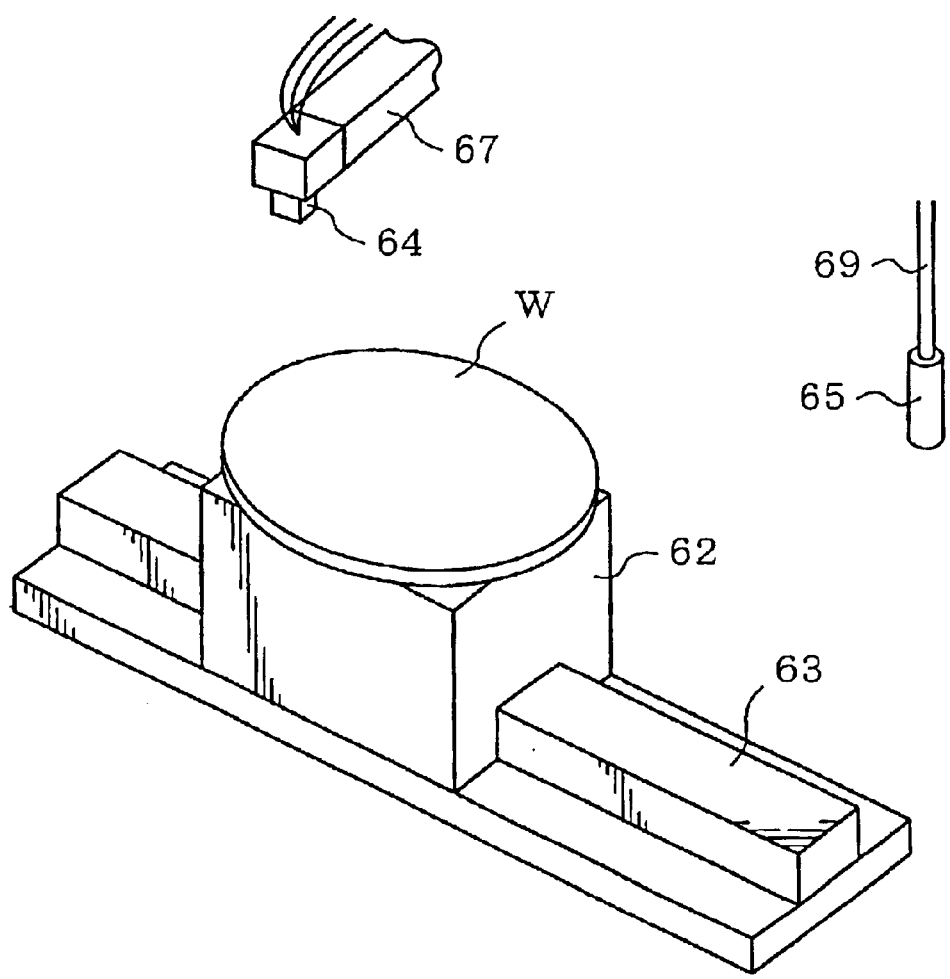
FIG. 4 is a perspective view of the inside of a peripheral aligner in the coating and developing system according to the present embodiment.
Figure 5:
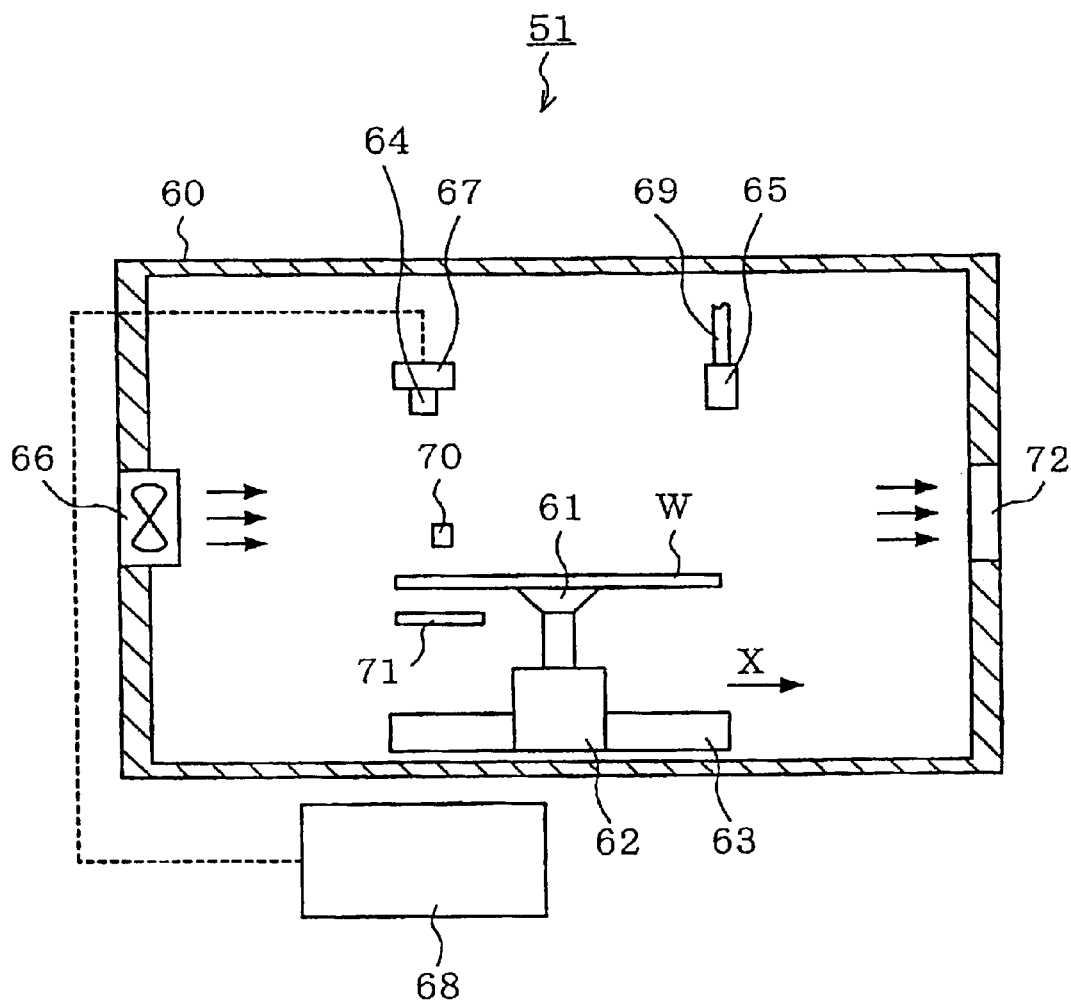
FIG. 5 is an explanatory view of a vertical section showing a structure of the peripheral aligner in the coating and developing system according to the present embodiment.

Next, a structure of the peripheral aligner 51 having film thickness measuring means will be explained based on FIGS. 4 and 5.

In a casing 60 of the peripheral aligner 51, provided is a mounting table 61 for sucking and holding the wafer W. The mounting table 61 is rotatable by a drive mechanism 62 in which a motor, for example, or the like is incorporated. Further, the drive mechanism 62 is movable on a rail 63 extending longitudinally (a horizontal direction in FIG. 5), whereby the mounting table 61 is movable longitudinally (the horizontal direction in FIG. 5). Above the wafer W, provided are a film thickness sensor 64 serving as a sensor member for sensing the film thickness of the resist film as a coating film with laser light, and a irradiating portion 65 for irradiating light for exposure.

Figure 6:
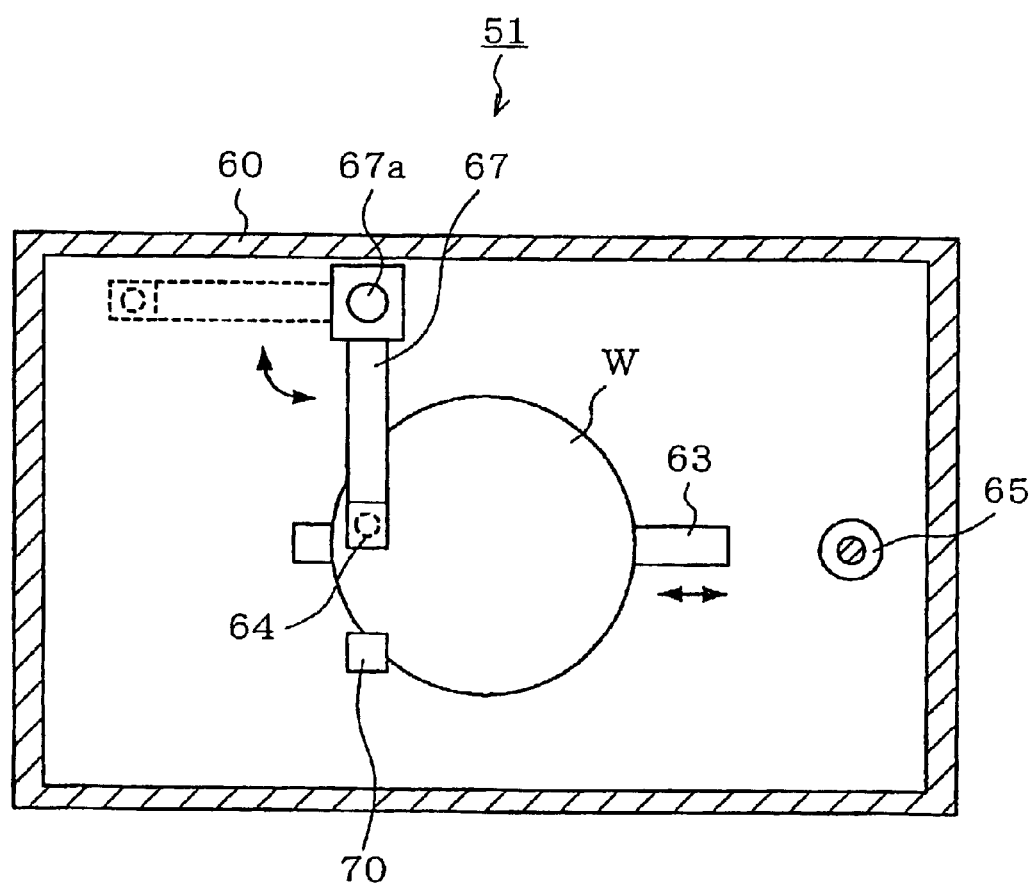
FIG. 6 is an explanatory view of a transverse section showing the structure of the peripheral aligner in FIG. 5.
Figure 7C:
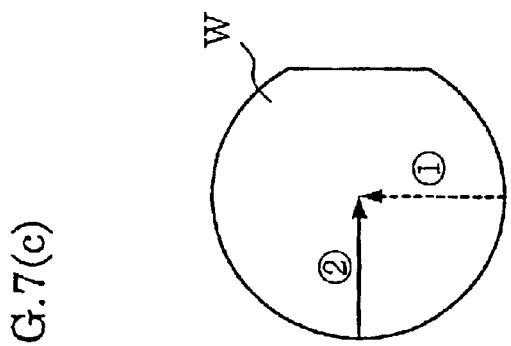
FIG. 7 is an explanatory view showing routes of film thickness measurements on a wafer in time series, which are performed in a peripheral aligner according to a first embodiment.
Figure 7B:
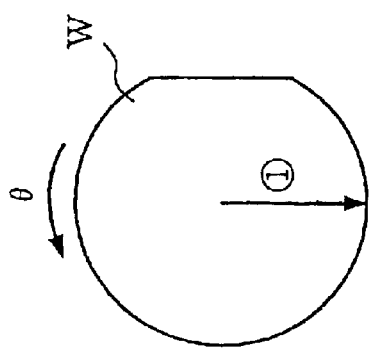
Figure 7E:
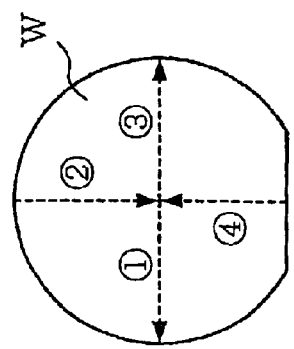
Figure 7A:
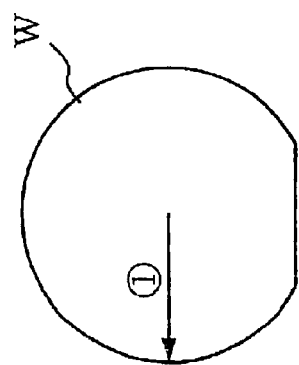
Figure 7D:
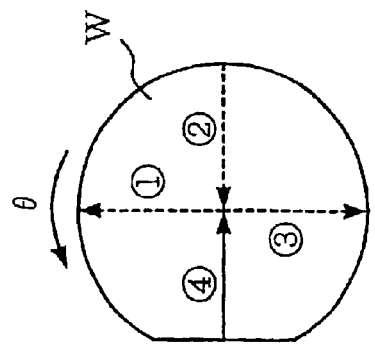

A fan 66 for suction is attached on one side of the casing 60 and an exhaust port 72 is provided on the other side thereof, whereby draft is formed from the fan 66 toward the exhaust port 72 to interchange an atmosphere in the peripheral aligner 51. The film thickness sensor 64 is arranged on the upstream side from the irradiating portion 65 in the draft. Moreover, the film thickness sensor 64 is hung up with an arm 67, and the arm 67 is rotatably attached about a rotation shaft 67a disposed on an edge of a wall of the casing 60 as shown in FIG. 6. Therefore, the arm 67 is rotated by a drive mechanism which is not shown so that the film thickness sensor 64 can be moved away from above the wafer W.

Further, the film thickness sensor 64 is connected to a film thickness sensor control unit 68 provided outside the casing 60, and the film thickness sensor control unit 68 converts light detected by the film thickness sensor 64 into data, stores them, and performs a measurement of the film thickness of the resist film based on the data. Furthermore, the irradiating portion 65 is fixedly provided on the casing 60. The irradiating portion 65 irradiates light on the wafer W from a light source portion which is not shown through a light conduit 69, to expose the resist film on the periphery of the wafer W. In addition, a laser light source 70 for emitting light to detect a precise position of the wafer and a CCD sensor 71 for detecting the light are provided, having the wafer W vertically sandwiched therebetween.

Next, processes of a test wafer W in the peripheral aligner 51 as structured above will be described together with a sequence of coating and developing processes.

First, the wafer carrier 7 takes an unprocessed wafer W out of the cassette C to carry it into the alignment unit 32 included in the third processing unit group G3. Second, the wafer W, of which alignment is completed in the alignment unit 32, is transferred through the adhesion unit 31 and the cooling unit 30 to the resist coating unit 15 or 17 by the main carrier unit 13. There, the top face of the wafer W is coated with a resist solution to form the resist film. After that, the wafer W is sequentially transferred to the prebaking unit 34 or 35 and the extension and cooling unit 41 to undergo predetermined processing.

Then, the wafer W is taken out of the extension and cooling unit 41 by the wafer carrier 50, and thereafter transferred to the peripheral aligner 51.

At this time, the fan 66 is operated in the peripheral aligner 51 to form the draft from the fan 66 toward the exhaust port 72 so that impurities such as organic substances can be exhausted from the inside of the casing 60 even if they are generated. Additionally, the film thickness sensor 64 is positioned on the upstream side in the draft, thereby preventing contamination by formation of the draft.

The wafer W, which is transferred to the peripheral aligner 51, is placed and suction-held on the mounting table 61. The wafer W, which is held on the mounting table 61, has coordinates of a perimetrical position thereof recognized by the laser light source 70 and the CCD sensor 71 so that it is determined whether the wafer W is placed on a predetermined position or not.

The measurement of the film thickness of the resist film will be explained hereinafter, using FIGS. 5, 6 and 7. First, the film thickness sensor 64, which is moved away from above the wafer W as shown by broken lines in FIG. 6, is moved to above the center of the wafer W by the arm 67. Second, laser light is irradiated from the film thickness sensor 64 and the light reflected from the resist film is again detected by the film thickness sensor 64 while the wafer W is moved in an X axis direction (a rightward direction in FIG. 5) by the drive mechanism 62.

The data detected by the film thickness sensor 64 are transmitted to the film thickness sensor control unit at any time and stored therein. After a while, the wafer W comes to a stop and also the film thickness measurement is brought to a stop when the film thickness sensor 64 is positioned above the peripheral portion of the wafer W. The film thickness measurement of one radius of the wafer W is performed by the above-described processes (FIG. 7(*a*), incidentally, trajectories of the measurement by the film thickness sensor 64 are indicated by the arrows and the order of the film thickness measurement is indicated by the circled figures). Next, the wafer W is rotated 90 degrees in a θ direction (a counterclockwise direction) by the drive mechanism 62 (FIG. 7(*b*)). This time, the wafer W is moved in a negative X axis direction (a leftward direction in FIG. 5), and the film thickness thereof is similarly measured by the film thickness sensor 64. Then, the wafer W is brought to a stop again and also the film thickness measurement comes into a stop when the film thickness sensor 64 is moved to above the center of the wafer W (FIG. 7(*c*)). The above-described measurement is performed at every 90 degrees, and finally every film thickness on diameters orthogonal to each other is measured as shown in FIG. 7(*d*) and the film thickness measurement is completed when the wafer W is rotated one turn (FIG. 7(*e*)).

Next, the wafer W is moved to below the irradiating portion 65 by the drive mechanism 62 and brought to a stop at a predetermined position. At this time, the arm 67, on which the film thickness sensor 64 is hung, is rotated by the drive mechanism which is not shown to move the film thickness sensor 64 away from above the wafer W. Thereafter, the wafer W is rotated in accordance with a predetermined recipe, and a resist coating film on the peripheral portion of the wafer W is exposed in a prescribed width with the laser light from the irradiating portion 65.

The wafer W, of which peripheral exposing processing is completed, has the film thickness measurement once again by the above-described processes. At that time, also a portion on the wafer W which undergoes peripheral exposing processing is measured and the data are stored in the film thickness sensor control unit 68 so that whether the exposed portion is performed at a predetermined position or not is inspected by the measured film thickness.

The wafer W, which completed the second measurement of the film thickness thereof, is carried to the outside of the aligner 51 by the wafer carrier 50 and the inspection of the test wafer W is completed.

As has been described, in the coating and developing system 1 according to the present embodiment, it is not necessary to take the wafer out of the coating and developing system 1 and the inspection can be performed in a sequence of the processes when the film thickness of the resist film is inspected since the peripheral aligner 51 is provided with the film thickness measuring means. Therefore, needless time and labor required to transfer the wafer W can be reduced. Moreover, since the peripheral aligner 51 is originally provided with the mounting table 61 which is necessary for the film thickness measurement, rotatable, and movable in at least one direction, the film thickness measuring means can be provided by utilizing the existing mechanism, whereby it is possible to measure the film thickness at any point on the wafer W and in addition a cost reduction is expected. Further, the film thickness measurement is performed before and after peripheral exposing processing, whereby it is possible to determine not only whether the resist film is correctly formed or not, but also whether peripheral exposure is properly performed or not. Furthermore, the film thickness sensor 64 for measuring the film thickness is provided on the upstream side in the draft relative to the irradiating portion 65, whereby it is possible to prevent the film thickness sensor 64 from being contaminated and its measuring ability from being deteriorated. Additionally, the arm 67 of the film thickness sensor 64 is made rotatable and can be moved away from above the wafer W during peripheral exposure, thereby preventing the film thickness sensor 64 from being contaminated also in this respect.

Now, another embodiment of the above-described processes of the film thickness measurement as shown in FIG. 7 will be described. First, according to a second embodiment, a starting position of a film thickness measurement is made a predetermined peripheral portion of the wafer W, and the film thickness sensor 64 is operated in the same manner as in the first embodiment to be kept waiting above the peripheral portion of the wafer W. Second, the film thickness measurement is performed by the film thickness sensor 64 fixed above the wafer W while the wafer W is moved in the negative X axis direction (the leftward direction in FIG. 5) by the drive mechanism 62 as shown in FIG. 8.

Figure 8C:
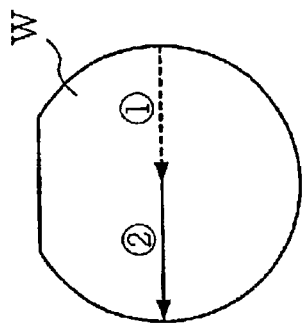
FIG. 8 is an explanatory view showing routes of film thickness measurements on a wafer in time series, which are performed in a peripheral aligner according to a second embodiment.
Figure 8B:
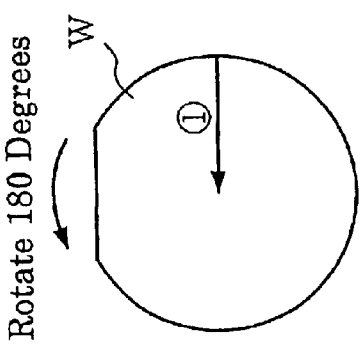
Figure 8A:
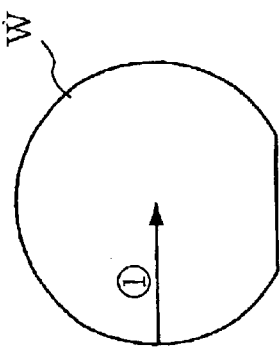
Figure 8F:
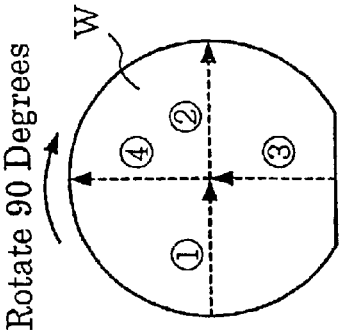
Figure 8E:
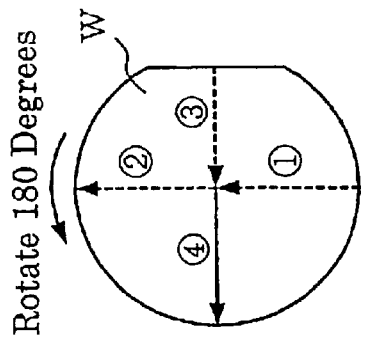
Figure 8D:
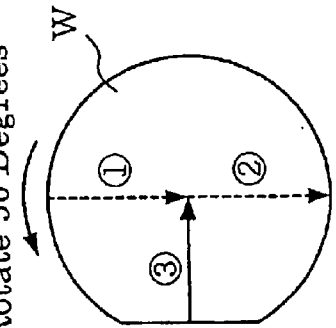
Figure 9A:
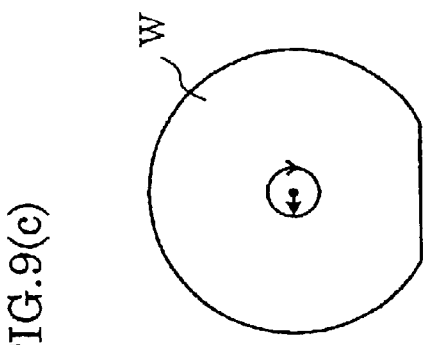
FIG. 9 is an explanatory view showing routes of film thickness measurements on a wafer in time series, which are performed in a peripheral aligner according to a third embodiment.
Figure 9B:
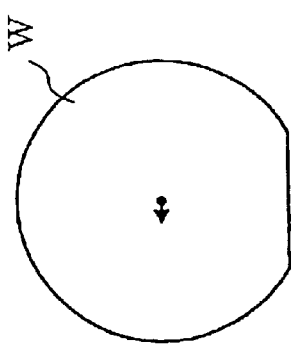
Figure 9C:
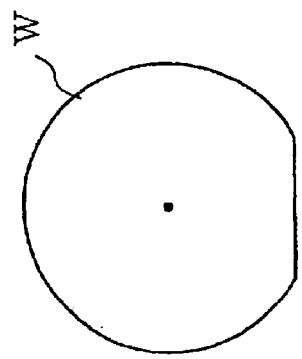
Figure 9D:
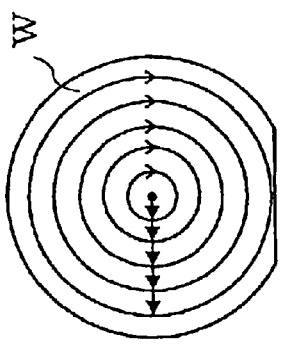
Figure 9E:
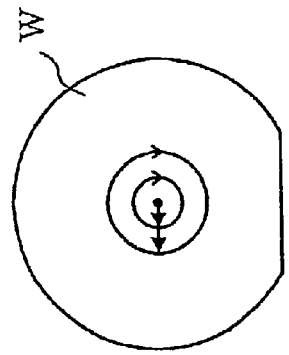

Then, the wafer W once comes to a stop and also the film thickness measurement is brought to a stop when the film thickness sensor 64 is positioned above the center of the wafer W (FIG. 8(a)). Next, the wafer W is rotated 180 degrees in the θ direction (the counterclockwise direction) by the drive mechanism 62 (FIG. 8(b)). This time, the wafer W is moved in a positive X axis direction (the rightward direction in FIG. 5), and the film thickness thereof is similarly measured by the film thickness sensor 64. Then, the wafer W is brought to a stop again and also the film thickness measurement comes to a stop when the film thickness sensor 64 is positioned above the peripheral portion of the wafer W (FIG. 8(c)). The film thickness measurement on one diameter of the wafer W is performed by the above-described processes. Further, the measurement on another diameter is performed in the same manner as in the above-described processes (FIGS. 8(a) to 8(c)) by rotating the wafer W 90 degrees in the θ direction by the drive mechanism 62 (FIGS. 8(d) and 8(e)). As a result, the film thickness on the diameters orthogonal to each other is measured as shown in FIG. 8(e), and the film thickness measurement is completed when the wafer W is finally returned to the starting position for the film thickness measurement (FIG. 8(f)). The same effect as that in the first embodiment can be obtained if the film thickness is measured by performing the above-described processes.

Furthermore, a third embodiment will be described. First, the film thickness sensor 64 is moved to above the center of the wafer W and kept waiting as shown in FIG. 9. There, the film thickness of the center of the wafer W is measured by the film thickness sensor 64 (FIG. 9(a)). Second, the wafer W is moved a predetermined distance in the X direction (the rightward direction in FIG. 5) and brought to a stop (FIG. 9(b)). There, the film thickness is measured while the wafer W is rotated in the θ direction (the counterclockwise direction) by the drive mechanism 62, and the film thickness measurement and the rotation is brought to a stop when rotated 360 degrees (FIG. 9(c)). Thereafter, the wafer W is again moved a predetermined distance in the X direction (the rightward direction in FIG. 5) and then brought to a stop, so that the film thicknesses on concentric circumferences are similarly measured by rotating the wafer W (FIG. 9(d)). The film thicknesses are concentrically measured toward the perimeter of the wafer W by repeating the processes as described above, the film thickness measurement is completed when the film thickness measurement of the peripheral portion of the wafer W is finished (FIG. 9(e)).

According to the third embodiment, although the film thickness is concentrically measured from the center toward the perimeter of the wafer W, the film thickness may be measured from the perimeter toward the center thereof. In addition, the above-described film thickness measurement is performed by irradiating the laser light from the film thickness sensor 64 and detecting again the light reflected from the resist film by the film thickness sensor 64, which may be performed either while the wafer W is moved or after it is once stopped when measured. The same effect as that in the first embodiment can be obtained also in this third embodiment.

Figure 10:
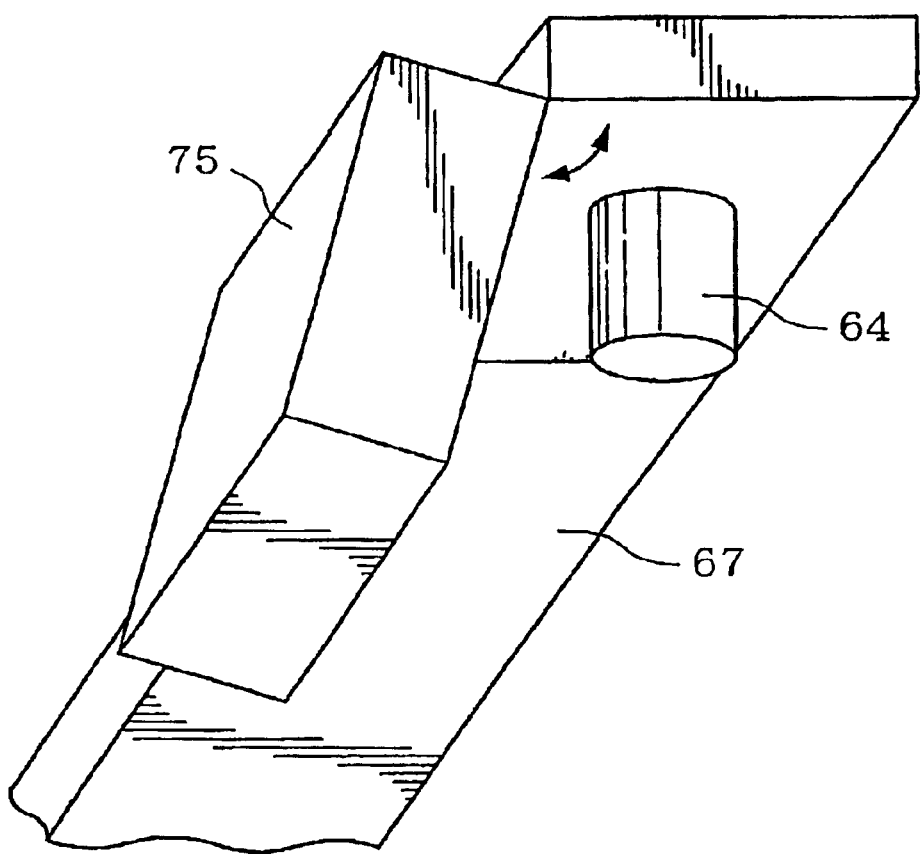
FIG. 10 is an explanatory view in a case where a cover for a film thickness sensor is attached to the film thickness sensor in the peripheral aligner according to the present embodiment.

A cover 75 serving as a protecting member may be attached to the film thickness sensor 64 as shown in FIG. 10. The cover 75 is structured so as to be opened during the film thickness measurement and closed at all other times. The opening and closing of the cover 75 is carried out by a drive mechanism which is not shown and controlled by the film thickness sensor control unit 68. Attaching such cover 75 can more surely prevent the film thickness sensor 64 from being contaminated.

Although the film thickness measurement is performed before and after the peripheral exposing processing in the above-described embodiment, it may be performed only before the peripheral exposing processing or only after the peripheral exposing processing.

A signal from the film thickness sensor 64 is structured so as to be transmitted to the film thickness sensor control unit 68 and undergo processing to output a film thickness value, and it is also possible to find a line width of a pattern formed on the wafer W by changing a program of the film thickness sensor control unit 68.

The principle will be explained hereinafter. The signal for the line width from the film thickness sensor 64 (such as strength and weakness of reflected light, for example) is stored in association with the line width in advance and saved as the signal data in correspondence with a certain line width value. Having such data beforehand makes it possible to find the line width on the wafer W by comparing the signal from the film thickness sensor 64 with the aforesaid stored data. It should be noted that higher precision is obtained in finding the line width on a mensurative wafer by forming a simple test pattern on the mensurative wafer in advance than on a production wafer having an ordinary intricate pattern, on the occasion of practically finding the line width.

Figure 11:
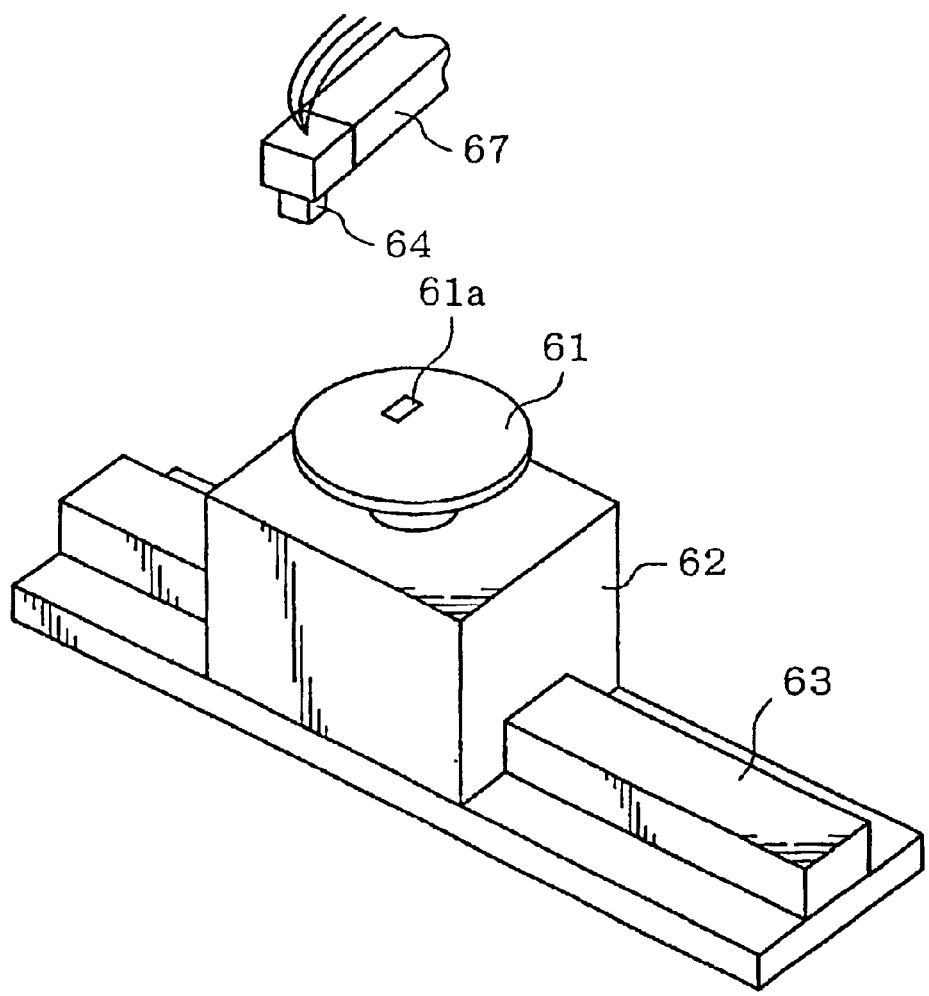
FIG. 11 is a perspective view showing a state where a reflecting object is provided on a mounting table.

Incidentally, it is inevitable that the light source used for the film thickness sensor 64 is deteriorated with the lapse of time with accompanying deterioration in strength of the irradiated light. It is difficult to precisely measure the film thickness when the strength of the light from the film thickness sensor 64 is deteriorated. Therefore, a reflecting object 61a is provided on the mounting table 61 on which the wafer W is placed as shown in FIG. 11. It is preferable to embed the reflecting object 61a in the mounting table 61 so as not to affect the placement of the wafer W.

In addition, periodically the film thickness sensor 64 is moved to above the mounting table 61 to irradiate light for measurement toward the reflecting object 61a in a state where the wafer W is not placed thereon. As a result, the strength of the light reflected from the reflecting object 61a can be measured. With deterioration of the light source, the strength of the reflected light is also deteriorated, thereby enabling a degree of deterioration in the light source to be detected by measuring the strength of the reflected light. Thus, it is possible to detect beforehand deterioration of the light source of the film thickness sensor 64, propriety of use thereof, and necessity for replacement thereof by providing the reflecting object 61a on a mounting table 61.

Moreover, it is preferable to use the test wafer as the wafer W used for the practical film thickness measurement in the processes of the film thickness measurement as described above. A plurality of the test wafers are housed in the specialized cassettes C in advance to be distinguished from the production wafers. In addition, the desirable timing of putting the test wafer into the coating and developing system 1 is in a break of a lot of the production wafers, or after coating and developing treatment is performed on a predetermined number of the production wafers W.

For example, after coating and developing treatment is performed on the production wafer W of one lot, and before the coating and developing treatment is performed on the production wafer W of the next lot, the test wafer is put into the coating and developing system 1, coated with a resist in the resist coating unit 15 or 17, subjected to baking processing, and thereafter the film thickness thereof is measured. When the film thickness is within a predetermined allowable range as a result of the measurement, putting the production wafer W into the coating and developing system 1 is started.

If the film thickness is not within the predetermined allowable range as a consequence of the measurement, necessary corrections such as, for example, a temperature of the resist solution, a rotational speed, and a temperature of the draft are made to the resist coating unit 15 or 17 in which coating treatment is practically performed. After the corrections, resist coating treatment is performed on another test wafer W in the resist coating unit 15 or 17, and thereafter the film thickness thereof is measured.

Then, when the film thickness is within the predetermined allowable range as a result of the measurement, putting the production wafer W into the coating and developing system 1 is started. If the film thickness is not within the predetermined allowable range as a result of the measurement, the necessary corrections are again made to the resist coating unit 15 or 17 in which coating treatment is practically performed, and hereafter the film thickness measurement is carried out with use of the test wafers W until the film thickness value enters within the allowable range.

Thus, resist coating treatment on the production wafer W can always be performed suitably by inspecting a state in the resist coating unit 15 or 17 beforehand.

Incidentally, as a result of the measurement of the film thickness on the test wafer, when it is within the allowable range, a program of the coating and developing system 1 is controlled so as to automatically start putting the production wafer W thereinto, and when it is out of the allowable range, an NG signal, for example, is indicated on a display or a control panel of the system or an appropriate alarm is given so as to stop putting the production wafer W into processing station 3, whereby defects of the production wafer W can be prevented from occurring and in addition it is possible for an operator to immediately make the necessary corrections to the resist coating unit 15 or 17.

As has been described, the film thickness measurement of the coating film can be performed in the substrate processing system, whereby it is not necessary to provide a film thickness measuring unit separately, according to the various embodiments of the present invention. Therefore, when the film thickness of the coating film on the substrate is inspected, the time, which is required for transferring the substrate from the substrate processing system to the film thickness measuring unit, can be reduced. Further, a mechanism in a conventional peripheral aligner can be intactly used, thereby increasing flexibility in points for the film thickness measurement and in addition reducing cost.

It is possible to prevent the impurities, such as the organic substances generated from the coating film on the substrate, from contaminating the sensor portion during exposure. If laser light having a single wavelength is used, the film thickness can be measured with higher precision. When a light-emitting diode is used for the light source of the sensor member, low power consumption is required, which results in a cost reduction. Additionally, it is possible to measure in a large area. Also the line width of the pattern can be measured, and deterioration in ability of the film thickness measuring means can be detected beforehand. Since the above-described film thickness measurement is performed before and after peripheral exposing processing, the film thickness value can be material for determining whether peripheral exposing processing is properly performed or not, whereby the yield on the production wafer can be improved.

Although the above embodiments describe the wafer processing system in the lithography in the processes of semiconductor wafer device fabrication, it is also applicable to processing systems of the other substrates besides the semiconductor wafer such as, for example, an LCD substrate.

The above-described embodiments have been disclosed with the intention of clarifying technical meaning of the present invention. Therefore, it is to be understood that the present invention is not intended to be limited to the above embodiments, and various changes may be made threrein without departing from the spirit of the present invention and within the meaning of the claims.

The entire disclosure of Japanese Patent Application No. 11-302214 filed on Oct. 25, 1999 including specification, claims, drawings and summary is incorporated herein by reference in its entirety.

What is claimed is:

1. A method of processing a substrate with use of a substrate processing system,
    wherein said substrate processing system comprises a peripheral aligner for irradiating the peripheral portion of the substrate with light to expose a coating film applied on the substrate; and
    wherein said peripheral aligner comprises a film thickness sensor for measuring a film thickness of the coating film inside said peripheral aligner, the method comprising the step of:
        irradiating the peripheral portion of the substrate with the light inside said peripheral aligner to expose the coating film after measuring the film thickness of the coating film on the substrate with the use of said film thickness sensor inside said peripheral aligner.

2. A method according to claim 1,
further comprising the step of measuring the film thickness of the coating film with said film thickness sensor once again after exposing the coating film.

3. A method according to claim 1,
wherein said substrate processing system further comprises a coating unit for coating the substrate with the coating film, the method comprising the steps of:
   using a test substrate as the substrate of which film thickness is measured and performing predetermined coating treatment on a production substrate in said coating unit when a measurement value is within an allowable range as a result of a measurement of the film thickness with the use of said film thickness sensor; and
   measuring the film thickness of another test substrate subjected to coating treatment in said coating unit with use of said film thickness sensor after making a necessary correction to said coating unit when the measurement value is out of the allowable range.

4. A method according to claim 3,
further comprising the step of warning the outside when the measurement value is out of allowable range.

5. A method according to claim 1,
further comprising the step of measuring the film thickness of the coating film with use of said film thickness sensor inside said peripheral aligner after exposing the coating film by irradiating the peripheral portion of the substrate with the light by said peripheral aligner.

6. A method according to claim 1,
wherein a draft is formed in said peripheral aligner, and said film thickness sensor is positioned on an upstream side in the draft from an irradiating portion which performs peripheral exposure.

7. A method according to claim 1,
further comprising the step of finding a line width of a pattern formed on the substrate by changing a program of a control unit of said film thickness sensor.

8. A method according to claim 1,
further comprising the step of measuring film thickness of a portion which undergoes peripheral exposing processing with said film thickness sensor and inspecting whether the exposed portion is performed at a predetermined position or not, after completing the peripheral exposure processing.

9. A method according to claim 1,
wherein a reflecting object provided on a mounting table on which the substrate is placed inside said peripheral aligner is included; further comprising the step of:
   irradiating the reflecting object with a light for measurement from said film thickness sensor in a state in which the substrate is not placed on the mounting table, and checking said film thickness sensor in advance by measuring an irradiated light at this time.

10. A method according to claim 1,
wherein said film thickness sensor is moved away from above the substrate during peripheral exposure processing.

* * * * *